United States Patent
Lenz et al.

(10) Patent No.: US 11,567,154 B2
(45) Date of Patent: Jan. 31, 2023

(54) MR SYSTEM WITH IMPROVED PROTECTION AGAINST CARDIAC STIMULATION

(71) Applicant: Siemens Healthcare GmbH, Erlangen (DE)

(72) Inventors: Helmut Lenz, Oberasbach (DE); Lennart Kilian, Gauting (DE); Daniel Niederlöhner, Erlangen (DE); Dirk Schneiderbanger, Langensendelbach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/542,356

(22) Filed: Dec. 3, 2021

(65) Prior Publication Data

US 2022/0179020 A1 Jun. 9, 2022

(30) Foreign Application Priority Data

Dec. 4, 2020 (DE) ...................... 10 2020 215 382.5

(51) Int. Cl.
*G01R 33/36* (2006.01)
*H03F 3/24* (2006.01)

(52) U.S. Cl.
CPC ..... *G01R 33/3664* (2013.01); *G01R 33/3614* (2013.01); *H03F 3/245* (2013.01); *H03F 2200/451* (2013.01)

(58) Field of Classification Search
CPC . G01R 33/3664; G01R 33/3614; H03F 3/245; H03F 2200/451
See application file for complete search history.

(56) References Cited

U.S. PATENT DOCUMENTS

| 6,169,403 B1 | 1/2001 | Hebrank |
| 6,671,330 B1 | 12/2003 | Lenz et al. |

(Continued)

FOREIGN PATENT DOCUMENTS

| DE | 19857525 A1 | 6/2000 |
| DE | 19913547 C2 | 7/2003 |
| DE | 102017219907 B3 | 10/2018 |

OTHER PUBLICATIONS

German Decision to Grant for German Application No. 10 2020 215 382.5 decision dated Nov. 9, 2021.

(Continued)

*Primary Examiner* — Daniel R Miller
(74) *Attorney, Agent, or Firm* — Lempia Summerfield Katz LLC

(57) ABSTRACT

A method for operating an MR system with a gradient power amplifier having at least one output stage that is connectable to a gradient coil, and having four switching elements connected to one another as an H-bridge includes, to operate the gradient coil, in alternation: switching the switching elements attached to a common first pole of a voltage supply to conductive and switching the switching elements attached to a common second pole of a voltage supply to blocking by inverting power drivers; and switching the switching elements attached to a common first pole of a voltage supply to blocking and switching the switching elements attached to a common second pole of a voltage supply to conductive by inverting power drivers. The switching elements attached to the first pole are switched by non-inverting power drivers, and the switching elements attached to the second pole are switched by inverting power drivers.

14 Claims, 5 Drawing Sheets

(56) References Cited

U.S. PATENT DOCUMENTS

2009/0026840 A1* 1/2009 Lenz .................. A61B 1/00158
　　　　　　　　　　　　　　　　　　　323/234
2014/0077812 A1* 3/2014 Sabate .................. G01R 33/34
　　　　　　　　　　　　　　　　　　　324/322
2019/0137580 A1　 5/2019 Lenz et al.

OTHER PUBLICATIONS

German Office Action for German Application No. 10 2020 215 382.5 dated Oct. 19, 2021.
International Standard, Edition 3.0; Mar. 2010; "Medical electrical equipment" IEC 60601-2-33. ISBN 978-2-88910-221-1. (2010). pp. 1-224.
German Decision to Grant for German Application No. 10 2020 215 382.5 decision dated Nov. 9, 2021, with English translation.
German Office Action for German Application No. 10 2020 215 382.5 dated Oct. 19, 2021, with English translation.

* cited by examiner

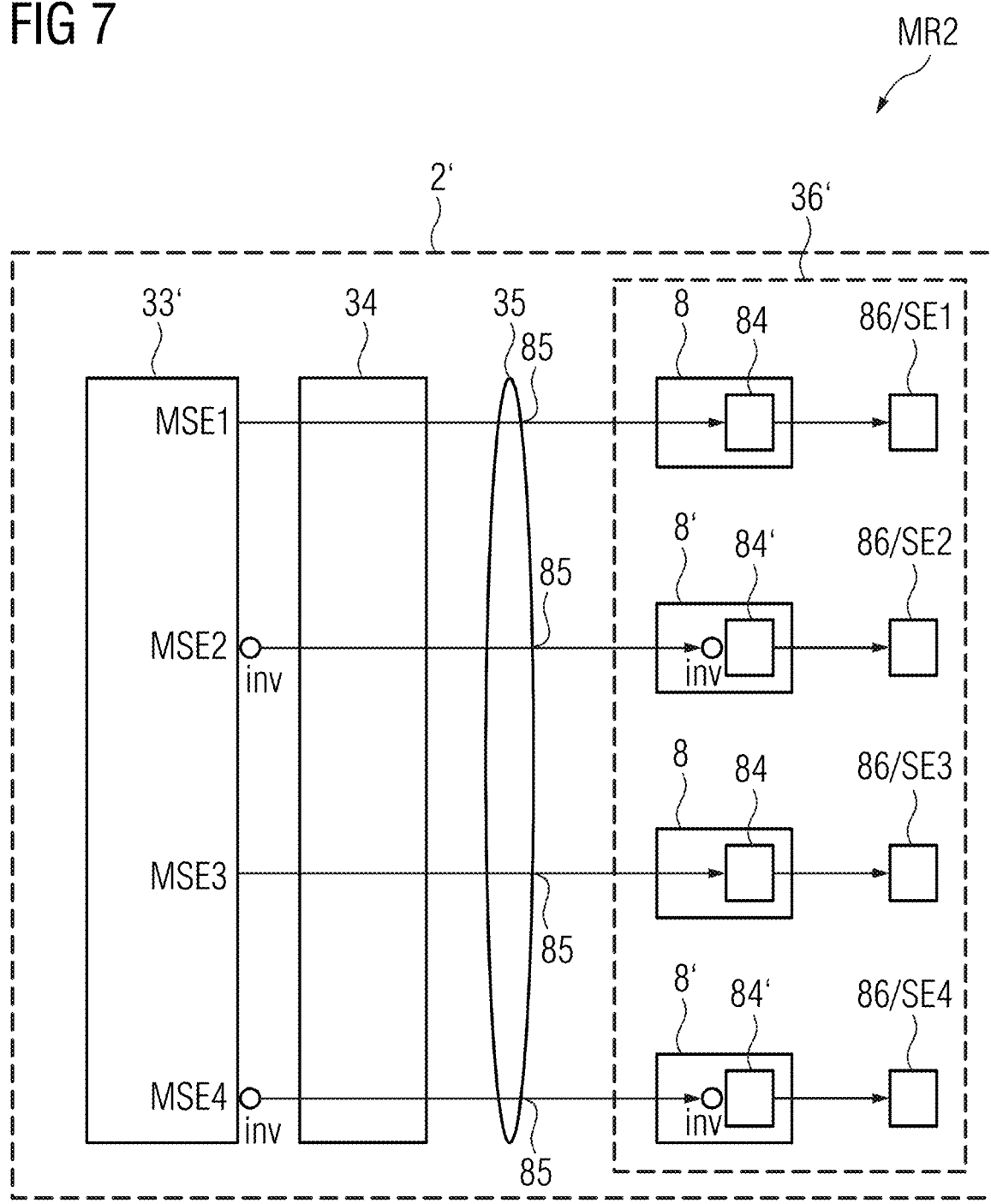

MR SYSTEM WITH IMPROVED PROTECTION AGAINST CARDIAC STIMULATION

This application claims the benefit of German Patent Application No. DE 10 2020 215 382.5, filed on Dec. 4, 2020, which is hereby incorporated by reference in its entirety.

BACKGROUND

The present embodiments relate to operating a magnetic resonance (MR) system with a gradient power amplifier. The present embodiments may, for example, be used on magnetic resonance imaging systems with a high gradient current.

Humans are sensitive to rapid changes in a magnetic flux dB/dt acting on them. A "sufficiently long-lasting" strong change in the magnetic flux may trigger nerve stimulation and/or stimulation of the myocardial tissue, where, according to IEC 60601-2-33, the temporal evaluation (e.g., "sufficiently long") of the rapid magnetic field change with regard to nerve stimulation is in the range of 0.12 ms to 0.8 ms and with regard to cardiac stimulation is in the range of 1 ms to 8 ms (e.g., usually approximately 3 ms are assumed).

Previous gradient systems of magnetic resonance (MR) imaging systems may trigger nerve stimulation; newer MR systems with a stronger gradient system may also trigger cardiac stimulation. Nerve stimulation primarily causes a sensation of pain, while cardiac stimulation may influence the heartbeat and is therefore to be considered to be life-threatening.

One method for calculating stimulation is known from DE 199 13 547 C2. This may be carried out by a program and a computer, using a suitably programmed processor or digital signal processor (DSP), or using an analog or digital hardware circuit. If the result of the calculation involves the crossing of a predetermined threshold value, a signal is triggered to provide that the gradient current flowing through a gradient coil is reduced sufficiently slowly for the gradient current to be non-stimulating. However, it is precisely this non-stimulating reduction of the gradient current that requires certain switching elements in an output stage of a gradient power amplifier (GPA) of the gradient system to be switched on while others are to be switched off. This process is referred to as "soft stop" and is, for example, disclosed in DE 198 57 525 A1. In contrast, simply switching off all the output stage switching elements (e.g., "hard stop") results in current reduction with the greatest possible edge steepness, but such a case should be avoided in order to avoid cardiac stimulation.

In MR systems with a gradient strength that may only trigger stimulation of the nerves, stimulation monitoring according to DE 199 13 547 C2 that causes the gradient current to be reduced slowly by the gradient power amplifier may be provided. No special additional safeguards are, however, provided since such MR systems work very reliably and a single instance of nerve stimulation in the case of a one-off hard stop is only perceived as a short pinprick. Multiple crossings of the nerve stimulation threshold in the short course of an MR sequence may be reliably prevented by existing stimulation monitoring.

Some MR systems that reach the cardiac threshold also have a monitoring system in gradient power amplifiers of the MR system to prevent the cardiac threshold from being crossed. In many cases, this monitoring system is redundant since a plurality of gradient power amplifiers are operated together and, using an additional measure, when one gradient power amplifier is shut down, the other gradient power amplifiers are shut down by soft stop.

The most common cause of a hard stop is a power failure. Therefore, each gradient power amplifier may contain a system for monitoring the mains voltage that is to react quickly enough for the power supply voltages for the actuation electronics to be available for a sufficient period of time to enable a slow current reduction (e.g., soft stop) initiated by this monitoring system to be completed. There are no further safeguards against other causes of a hard stop (e.g., a power supply failure, a failure of the clock-pulse supply for modulator FPGAs, malfunction of the modulator, etc.). Therefore, it is necessary for a defibrillator and a physician to be quickly available at such research facilities.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a hard stop and/or damage to an output stage of a gradient power amplifier of a magnetic resonance (MR) system may be prevented in a manner that is easy to implement.

A method for operating an MR system with a gradient power amplifier that has at least one output stage that may be connected to a gradient coil and has four switching elements connected to one another as an H-bridge (e.g., full bridge) that are switched using respective power drivers is provided. The method, to operate the gradient coil, includes, in alternation: switching the switching elements attached to a common first pole of a voltage supply to conductive and switching the switching elements attached to a common second pole of a voltage supply to blocking using inverting power drivers; and switching the switching elements attached to a common first pole of a voltage supply to blocking and switching the switching elements attached to a common second pole of a voltage supply to conductive using inverting power drivers. The switching elements attached to the first pole are switched using non-inverting power drivers, and the switching elements attached to the second pole are switched using inverting power drivers.

This method has the advantage that, in the event of the failure of the actuating signals actuating the output stage and thus also the switching elements, the switching elements connected to the non-inverting power drivers are blocking, while the switching elements connected to the inverting power drivers are conductive. This corresponds to a soft stop, whereas previously all four switching elements were switched to blocking if the actuating signals failed thus causing a hard stop. This exploits the fact that, if the actuating signals fail, the non-inverting power drivers set a corresponding switching signal for the switching elements to, for example, "low", while the non-inverting power drivers set a corresponding switching signal for the switching elements to, for example, "high" (e.g., to a signal logically inverted to a corresponding input signal). Such an output stage may also be referred to as a "self-locking output stage".

The gradient power amplifier, for example, enables the generation of a gradient field in a corresponding magnet room that is strong enough to influence the heartbeat of a person inside in the event of a hard stop.

The at least one gradient coil generates a magnetic gradient field in the magnet room. A plurality of gradient coils may be used to generate gradients separately (e.g., in all spatial directions). For example, there may be three gradient coils for the three Cartesian spatial directions x, y, and z. The gradient coils may, for example, be attached to center terminals of the H-bridge.

In one development, the switching elements are semiconductor switches (e.g., semiconductor power switches). The switching elements may, for example, be unipolar transistors (e.g., power MOSFETs) or bipolar transistors such as IGBTs, etc. The semiconductor switches may be N-channel transistors or P-channel transistors. The semiconductor switches may be self-locking or self-conducting.

The power drivers output switching signals to the switching elements (e.g., to corresponding control terminals), for example, in the case of IBGTs to corresponding gate terminals, etc.

The first pole may, for example, be a positive pole of a direct-voltage terminal of the output stage, while the second pole is a negative pole, or vice versa.

Therefore, in normal operation, the output stage may generate an output voltage for supplying an associated gradient coil in that the switching elements attached to a common pole or to power drivers of the same type (e.g., inverting or non-inverting) are not switched simultaneously or are switched alternately to conductive or to blocking and, vice versa, the switching elements attached to the other pole or to power drivers of a different type (e.g., non-inverting or inverting) are switched to blocking or to conductive.

In normal operation, an output stage may further generate the output voltage zero at the associated gradient coil in that the switching elements attached to a common pole or to power drivers of the same type (e.g., inverting or non-inverting) are simultaneously switched to conductive or to blocking and vice versa the switching elements attached to the other pole or to power drivers of a different type (e.g., non-inverting or inverting) are simultaneously switched to blocking or to conductive.

In one embodiment, a modulator actuates the non-inverting power drivers with an actuating signal and actuates the inverting power drivers with a signal inverted thereto. This enables the control elements as such to be actuated in an identical manner that is easy to implement. If, for example, a switching element is to be switched to conductive by setting the level of the switching signal, the following signal chain may be implemented for a non-inverting power driver:

Level at the modulator output of the modulator connected to the input of the non-inverting power driver (e.g., possibly via a further driver (module)): "high"—level at the output of the power driver to the control terminal of the control element: "high", while the following signal chain may be implemented for an inverting power driver:

Level at the modulator output: "low"—logically inverted level at the output of the power driver: "high".

If the modulator fails, the signal levels at all modulator outputs are "off". The non-inverting power drivers then output a "low" switching signal to corresponding switching elements, which consequently block. In contrast, in this case, the inverting power drivers output a "high" switching signal to corresponding switching elements, which thus conduct.

In one embodiment, the power drivers in each case have a receiver of an optocoupler or a receiving side of an optical fiber path via which the actuating signals are received and forwarded to electronics of the power drivers. The actuating signals of the inverting power drivers are inverted at corresponding electronics. In this context, "off" or "low" at a modulator output may be "light flux of the actuation off". This embodiment achieves the advantage of galvanic isolation of the power drivers from the modulator or an intermediate potential isolation apparatus. The transmitter of the optocoupler or the input of the optical fiber path (e.g., an LED) may be directly or indirectly attached to a modulator output (e.g., via a driver, such as a modulator signal driver).

In one embodiment, a smoothing capacitor is connected in parallel upstream of power supply terminals of the electronics. The capacitance of the smoothing capacitor is dimensioned such that, in the event of the failure of an alternating voltage supplying the power drivers, the switching elements may be switched at normal switching frequency at least for a reaction time of voltage monitoring facilities. After this, energy is still available for at least one switch-on operation of the switching elements, and the last statically switched-on state of the switching element is held for at least one soft stop current reduction period.

In one embodiment, the switching elements are turned on with a delay of a predetermined safety time $t_{tot}$. This has the advantage that a recurring bridge short circuit is reliably prevented when the switching elements are switched over, thereby preventing damage to the output stage. The safety time $t_{tot}$ delays each switching on of a switching element, but not the switching off. The safety time $t_{tot}$ may, for example, be effected by the modulator and/or by the output stage itself.

As another example, an MR system having a system controller and a gradient power amplifier, where the gradient power amplifier has at least one self-locking output stage that may be connected to a gradient coil and has four switching elements connected to one another as an H-bridge that are switched using respective power drivers is provided. The switching elements attached to a common first pole of a voltage supply are switched using non-inverting power drivers, and the switching elements attached to a common second pole of a voltage supply are switched using inverting power drivers. The MR system may be embodied analogously to the method, and vice versa, and has the same advantages. The MR system I, for example, configured to carry out the above-described method.

In one embodiment, the MR system has four switching elements in the form of bipolar transistors and four diodes, where a collector terminal of a first switching element is attached to the first pole and an emitter terminal of the first switching element is attached to a collector terminal of a second switching element. An emitter terminal of the second switching element is attached to the second pole, a center terminal between the first switching element and the second switching element is connected to a center terminal of a series connection of a first diode and a second diode, a cathode terminal of the first diode is attached to the positive pole, and an anode terminal of the second diode is attached to the negative pole. A collector terminal of a third switching element is attached to the first pole, and an emitter terminal of the third switching element is attached to a collector terminal of a fourth switching element. An emitter terminal of the fourth switching element is attached to the second pole, a center terminal between the third switching element and the fourth switching element is connected to a center terminal of a series connection of a third diode and a fourth diode, a cathode terminal of the third diode is attached to the positive pole, and an anode terminal of the fourth diode is attached to the negative pole.

In an embodiment, the switching elements are normal-blocking bipolar transistors (e.g., IGBTs, such as N-channel IGBTs).

In one embodiment, at least one gradient coil is attached to an output of the output stage that is connected to the center terminals between the first switching element and the second switching element and between the first diode and the second diode, and is attached to an output of the output stage that is connected to the center terminals between the third switching element and the fourth switching element and between the third diode and the fourth diode.

As yet another example, a computer program product having code that, when carried out on an MR system, carries out the above-described method is provided.

BRIEF DESCRIPTION OF THE DRAWINGS

The above-described properties, features, and advantages of this invention and the manner in which these are achieved will become clearer and more plainly comprehensible in conjunction with the following schematic description of exemplary embodiments explained in more detail in conjunction with the drawings. For the sake of clarity, elements that are the same or have the same function may be provided with the same reference characters.

FIG. 7 shows one embodiment of a gradient power amplifier of an MR system with an output stage.

DETAILED DESCRIPTION

Figure 1:
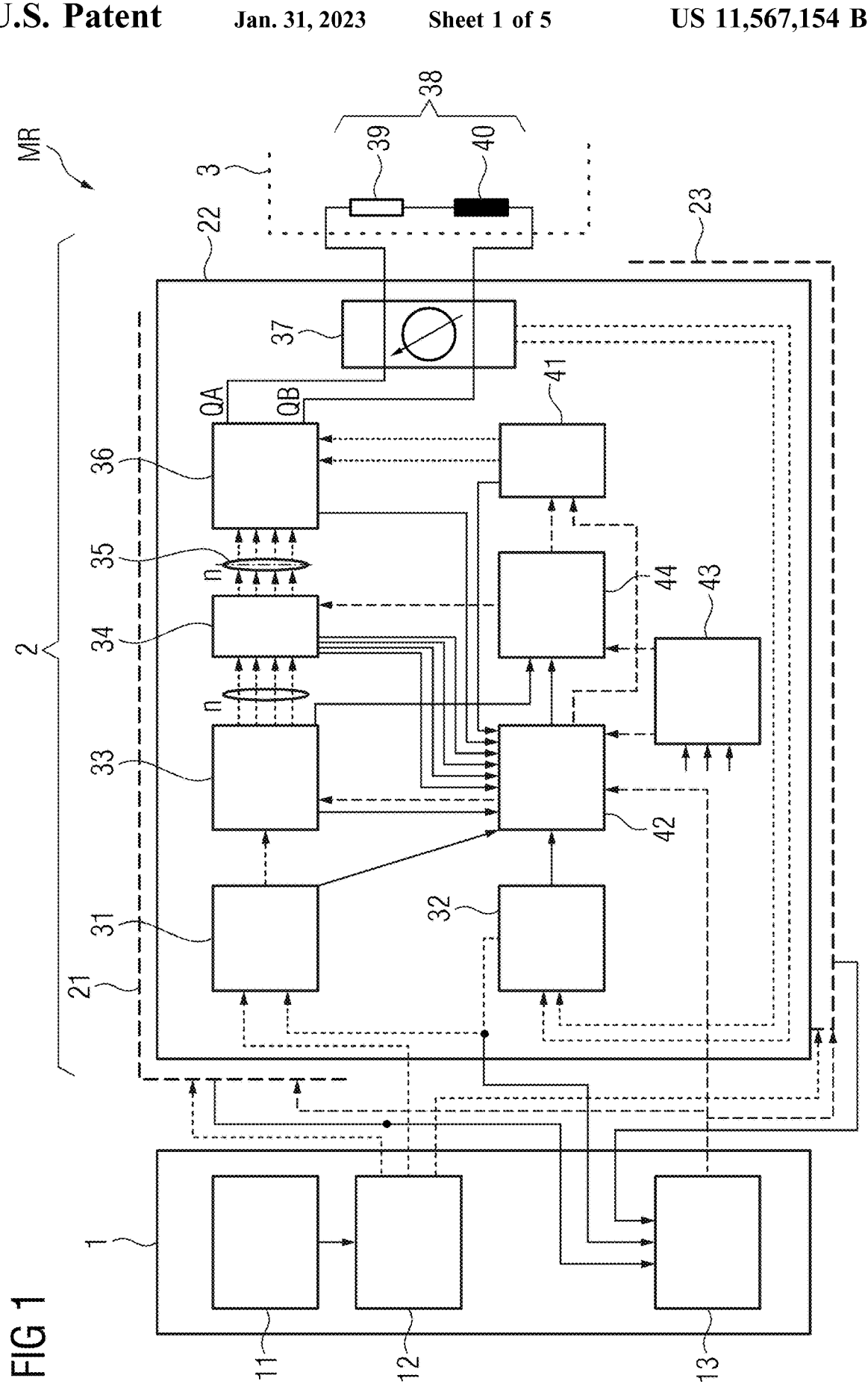
FIG. 1 shows a functional sketch of components of one embodiment of an MR device for generating a gradient field including a gradient power amplifier.

FIG. 1 shows a functional sketch of components of a magnetic resonance (MR) system MR for generating a gradient field including a system controller 1 and a gradient power amplifier (GPA) 2.

The system controller 1 contains a sequence controller 11 that generates specifications for radio frequency (RF) pulses and gradient pulses. The specification for the gradient pulses is converted by a setpoint generating facility 12 into setpoints for three gradient axes. For this purpose, the setpoints are transferred to axis-related gradient amplifying apparatuses 21 (e.g., for the x gradient), 22 (e.g., for the y gradient), and 23 (e.g., for the z gradient) of the gradient power amplifier 2. FIG. 1 depicts the axis-related gradient amplifying apparatuses 21, 22, 23 as separate units, but the axis-related gradient amplifying apparatuses 21, 22, 23 may also be combined in one unit.

Within one of the gradient amplifying apparatuses 21, 22, 23 (e.g., exemplified by the gradient amplifying apparatus 22), a respective regulator 31 has an input for the setpoint generated by the setpoint generating facility 12. A further input of the regulator 31 receives an actual current value from an actual value amplifier 32. A manipulated variable for a modulator 33 that generates pulse-width modulated actuating signals for an output stage 36 is generated at a signal output of the regulator 31. The output stage 36 consists, for example, of at least one H-bridge circuit of power switches SE1 to SE4 (e.g., IGBTs, see FIG. 2 to FIG. 4), where the output stage 36 receives respective actuating signals for each of the power switches SE1 to SE4. The actuating signals are transmitted potential-free to drivers of the H-bridge. For this purpose, a potential isolation apparatus 35 that is able to use optocouplers, for example, is provided.

An actuation driver stage 34 is provided to provide that the modulator 33, which, for example, has a field programmable gate array (FPGA) or another logic module, is relieved of the actuation current of the potential isolation apparatus 35. An input of the actuation driver stage 34 may be used to set all actuating signals to the "off" state, thus blocking all power switches SE1 to SE4 in the output stage 36. A power supply unit 41 is used to supply power to the output stage 36.

The associated axis-related gradient coil 38 is attached to the outputs QA, QB of the output stage 36 in the magnet room 3 via a current measuring unit 37. The gradient coil 38 has, for example, an inductor 40 and an ohmic resistor 39.

In the current measuring unit 37, a gradient current is, for example, measured twice. These measurement signals are evaluated by the actual value amplifier 32, which uses the measurement signals to form an actual value for the regulator 31.

A monitoring unit 42 is provided for the operational reliability of the gradient power amplifier 2. The monitoring unit 42 evaluates numerous monitoring signals. For example, the monitoring unit 42 receives a message from the actual value amplifier 32 as to whether the actual current value is plausible with respect to the two measurement signals of the current measuring unit 37 and as to whether a maximum actual current value is not exceeded. The monitoring unit 42 receives from the regulator 31 a signal about the magnitude of the regulating difference (e.g., the deviation between the setpoint and the actual value and the value of a manipulated variable for the modulator 33). The modulator 33 may provide information as to whether the regulating circuit is oscillating. From the monitoring of the outputs of the actuation driver stage 34, it may be deduced whether the output stage 36 is being actuated with the correct switching frequency and whether the actuating signals for the output stage 36 do not contain any actuation for the bridge short circuit. The monitoring unit 42 also obtains information about the output stage temperature, for example, from the output stage 36.

A further monitoring facility 13, depicted purely by way of example as a component of the system controller 1, is provided to protect the patient from nerve stimulation (e.g., peripheral nerve stimulation (PNS)). The arrangement of the monitoring facility 13 in the system controller 1 has a number of advantages. For example, monitoring thresholds may be easily specified by the system controller 1, and a rough advance calculation of the gradient setpoints for the monitoring facility 13 enables a statement to be made as to whether the pulse sequence with the selected settings will remain within specified monitoring limits and, to be precise, even before the user has started the sequence in question.

For the actual PNS monitoring, the monitoring facility 13 receives the actual current values of the actual value amplifiers 32 of the axis-related gradient amplifying apparatuses 21, 22, and 23. Herein, it is assumed that I~G~B applies (e.g., that the gradient current I is proportional to the gradient G, and this is proportional to a flux density B in the gradient coil 38 caused by the gradient G). If the superimposition and temporal evaluation of the actual current values results in a threshold value being exceeded, the monitoring unit 13 sends a shutdown signal to the monitoring unit(s) 42. The monitoring unit 42 may be present as a single unit for all gradient amplifying apparatuses 21, 22, and 23; separation into one monitoring unit each for the gradient amplifying apparatuses 21, 22 and 23 is less useful, but possible in principle.

The modulator 33 may be a cross-axis module, even if many calculations and functions have to take place on an axis-specific basis. This allows the use of a common clock for the FPGAs of the respective modulators 33, a common signal to terminate the actuation of the output stages 36, a common signal to switch the power supply unit 41 on and off, and common supply voltages for many parts of the electronics of the gradient amplifying apparatuses 21, 22 and 23.

From the output stages 36 and the power supply unit 41, the monitoring unit 42 receives monitoring signals for the level of the voltages for the power drivers for actuating the H-bridges in the output stages 36 and for the level of the power supply voltages of the output stages 36 generated by the power supply unit 41.

All further supply voltages (e.g., +/−15 V for the actual value amplifier 32 and the current sensors in the current measuring unit 37, +5 V for the modulator signal drivers (not shown) in the actuation driver stage 34, the supply voltages of the FPGAs of the modulator 33, and the clock generation) are monitored in a voltage monitoring facility 43. The voltage monitoring facility 43 has two outputs, one leading to the monitoring unit 42 and the other leading to a monitoring unit 44. While the monitoring unit 42 may have an FPGA or a logic module with the same function that requires a plurality of supply voltages and a clock for many functions, the monitoring unit 44 may have an unclocked digital part that is applied to only one digital supply voltage, which may correspond to the supply voltage of the actuation driver stage 34.

In the voltage monitoring facility 43, the supply voltages may be monitored with respect to at least two tolerance windows (e.g., +/−0.7 V and +/−0.9 V at a normal voltage of +15 V). The narrower tolerance window (e.g., 0.7 V) is dimensioned such that it is recognized that there is an error in a supply voltage, but at the same time, the error is not so large that the electronics affected by this supply voltage will no longer function. If the further tolerance window (e.g., 0.9 V) is exceeded, it is to be expected that parts of the electronics will now no longer function, which, especially for the FPGAs in the regulator 31, the modulator 33, and the monitoring unit 42, may have very severe consequences (e.g., failure). For example, a malfunction of the modulator 33 may result in a destructive actuation of the output stage 36; it would also be possible for actuation that stimulates the patient to be generated. A malfunction of the monitoring unit 42 may result in both the failure of this monitoring and a shutdown because the PNS threshold has been exceeded.

If only the narrower tolerance limit is reached, the monitoring unit 42 receives a shutdown signal, and the monitoring unit 42 outputs a shutdown signal to the modulator 33. If the further tolerance limit is reached, an error signal or shutdown signal is additionally sent to the monitoring unit 44, from which the shutdown command is output to the actuation driver stage 34. The monitoring unit 44 also checks whether the FPGAs are configured and whether, for example, the clock frequency for the FPGAs is in the permitted frequency range. If the monitoring unit 44 establishes that the conditions necessary for the function of the FPGAs are not met, the shutdown signal for the actuation driver stage 34 is also generated.

The shutdown command from the monitoring unit 42 to the modulator 33 causes the modulator 33 to actuate the output stage 36 in accordance with a "soft stop". The shutdown command from the monitoring unit 44 to the driver stage 34 causes the immediate blocking of all the switching elements SE1 to SE4 of the output stage 36 and thus a "hard stop".

Figure 2:
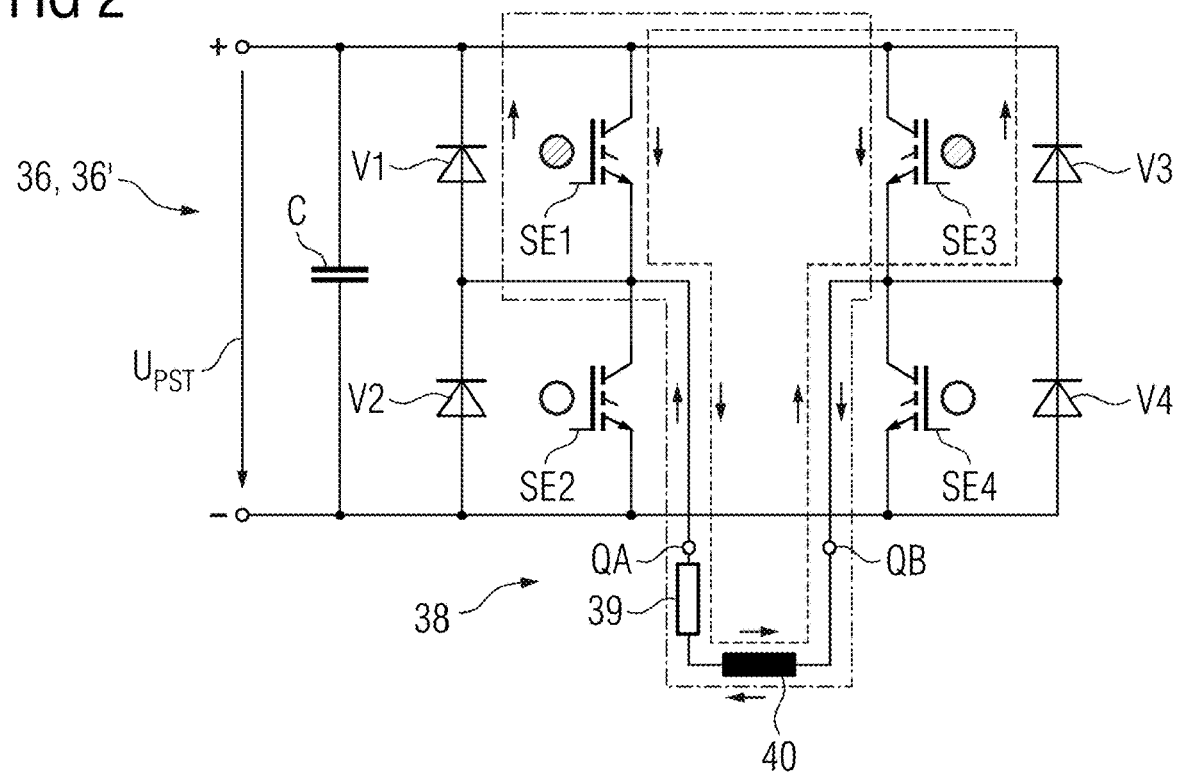
FIGS. 2 to 4 show a circuit diagram of an output stage of the MR device from FIG. 1 in different switching positions.
Figure 3:
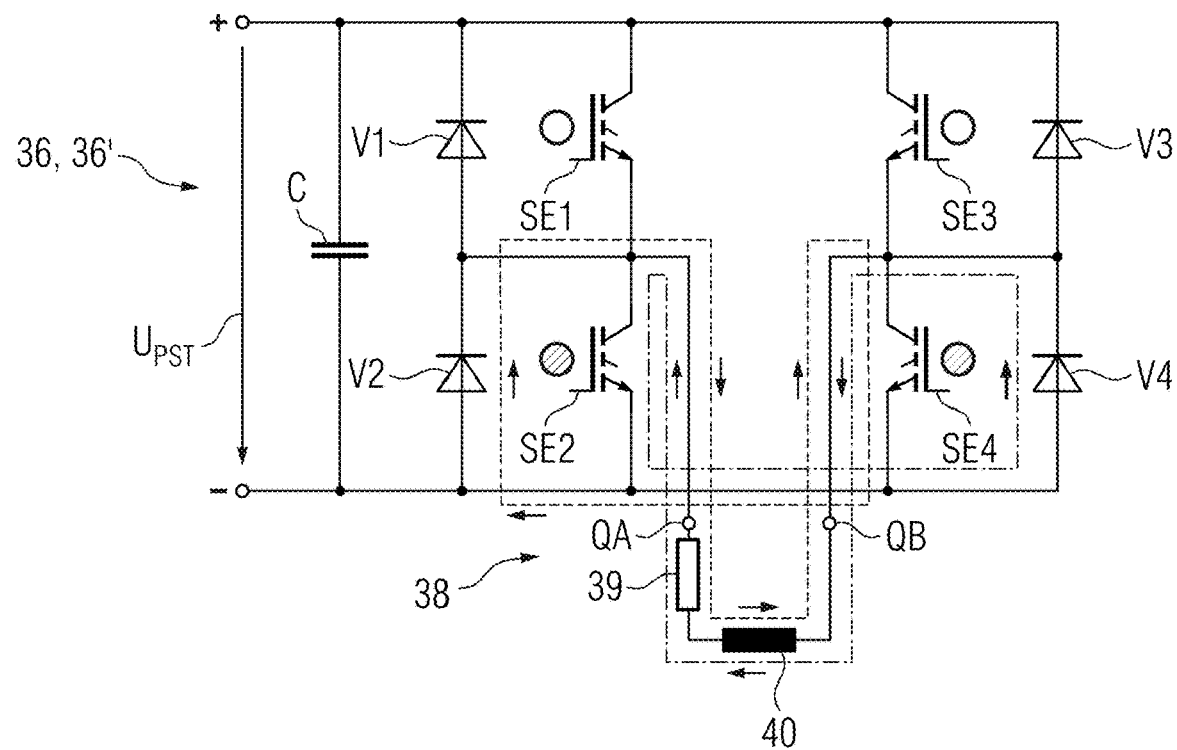
Figure 4:
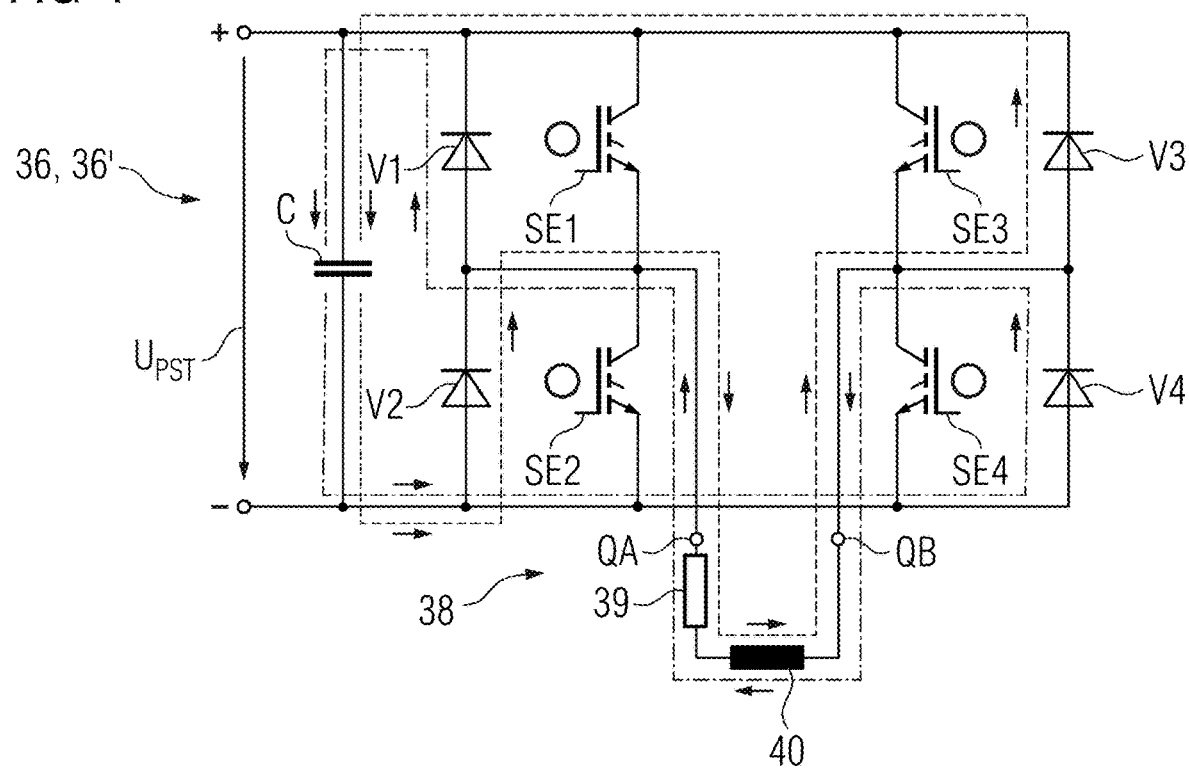

FIGS. 2 to 4 show a possible circuit diagram of the output stage 36 (e.g., partial output stage), which has, for example, a single H-bridge by way of example. The H-bridge includes four switching elements SE1 to SE4 in the form of normal-blocking N-channel IGBTs and four diodes V1 to V4 as power switches. The H-bridge is provided with a supply voltage UPST from the power supply unit 41 that may be tapped via a positive pole marked "+" and via a negative pole marked "−".

A collector terminal of the first switching element SE1 of the H-bridge is attached to the positive pole, and an emitter terminal of the first switching element SE1 is attached to a collector terminal of the second switching element SE2. The emitter terminal of the second switching element SE2 is attached to the negative pole. A center tap or center terminal between the first switching element SE1 and the second switching element SE2 is connected to a center terminal of a series connection of a first diode V1 and a second diode V2 (e.g., to an anode terminal of the first diode V1 and a cathode terminal of the second diode V2). Thus, the emitter terminal of the first switching element SE1, the collector terminal of the second switching element SE2, the anode terminal of the first diode V1, and the cathode terminal of the second diode V2 form a node. The cathode terminal of the first diode V1 is attached to the positive pole, while the anode terminal of the second diode V2 is attached to the negative pole.

Analogously, a collector terminal of the third switching element SE3 is attached to the positive pole and an emitter terminal of the third switching element SE3 is attached to a collector terminal of the fourth switching element SE4. The emitter terminal of the second switching element SE2 is attached to the negative pole. A center terminal between the third switching element SE3 and the fourth switching element SE4 is connected to a center terminal of a series connection of a third diode V3 and a fourth diode V4 (e.g., to an anode terminal of the third diode V3 and a cathode terminal of the fourth diode V4). Thus, the emitter terminal of the third switching element SE3, the collector terminal of the fourth switching element SE4, the anode terminal of the third diode V3, and the cathode terminal of the fourth diode V4 form a node. The cathode terminal of the third diode V3 is attached to the positive pole, while the anode terminal of the fourth diode V4 is attached to the negative pole.

Thus, the collector terminals of the first switching element SE1 and the third switching element SE3 and the cathode terminals of the first diode V1 and the third diode V3 form a common node with the positive pole. Analogously, the emitter terminals of the second switching element SE2 and the fourth switching element SE4 and the anode terminals of the second diode V2 and the fourth diode V4 form a common node with the negative pole.

In addition, a capacitor C connected in parallel to the H-bridge is provided to keep a voltage UPST of the output stage 36 substantially constant in the event of load fluctuations.

The gate terminals of the switching elements SE1 to SE4 are in each case attached to associated power drivers 8 or 8' (see FIG. 5 and FIG. 6) and are hence optionally switched to conductive and blocking or on and off by control signals of the power drivers 8, 8'.

The H-bridge further has outputs QA and QB to which the at least one gradient coil 38 for a gradient axis is attached. Output QA is connected to the center terminals between the first switching element SE1 and the second switching element SE2 and between the first diode V1 and the second diode V2 (or to the associated node), and output QB is connected to the center terminals between the third switching element SE3 and the fourth switching element SE4 and between the third diode V3 and the fourth diode V4 (or to the associated node).

If the output stage 36 is a partial output stage from a series connection of a plurality ("n") of partial output stages, the output QB of the first partial output stage is connected to the output QA of the second partial output stage, the output QB of the second partial output stage is connected to the output QA of the third partial output stage, etc. The gradient coil 38 is attached to the output QA of the first partial output stage and the output QB of the last partial output stage.

FIG. 2 depicts a case in which, as indicated by the solid black circle, the switching elements SE1 and SE3 attached to the positive pole are switched on/switched to conductive, and as indicated by the empty circle, the switching elements SE2 and SE4 attached to the negative pole of the voltage supply are switched off/switched to blocking. A current flowing in the gradient coil 38 from the output QA to the output QB, which is driven by the inductor 40 of the gradient coil 38 (indicated by the dashed line), finds its way through the diode V3, the switched-on switching element SE1, and the resistor 39 to the inductor 40. In the opposite direction (indicated by the dashed-dotted line), the current finds its way through the resistor 39, the diode V1, and the switching element SE3 back to the inductor 40. Overall, a voltage occurs at the inductor 40a that corresponds to the sum of the voltages at the resistor 39, a diode voltage, and the voltage of a switched-on element. At high currents, the semiconductor voltages at the switching elements SE1 to SE4 and the diodes V1 to V4 are negligible; the voltage then approximately corresponds to the voltage at resistor 39.

FIG. 3 depicts a case in which the switching elements SE2 and SE4 are switched on, but the switching elements SE1 and SE3 are switched off, as indicated by the corresponding circles. With respect to the current flow, the same number of diode voltages and switching element voltages is obtained as in FIG. 2, and thus, the same voltage is obtained at resistor 39.

A current I flowing in the inductor 40 is reduced by the sum of these voltages. At high current, the current is reduced according to an exponential function with the time constant L/R with L being the inductance value of the inductor 40 and R being the resistance value of the ohmic resistor 39. The larger L is and the smaller R is, the greater the time constant and the slower or less steep the current reduction.

FIG. 2 and FIG. 3 correspond to a soft stop state of the output stage 36.

In FIG. 4, all the switching elements SE1 to SE4 are switched off. The current now flows through the diode V3, through the capacitor C, which is charged in the process, through the diode V2 and through the resistor 39, and in the opposite direction, through the resistor 39, the diode V1, the capacitor C, and the diode V4. If the semiconductor voltages at high current are ignored, the voltage at the inductor 40 corresponds to the sum of UPST and the voltage at the resistor 39. Since the voltage at the resistor 39 is small compared to UPST and UPST is kept almost constant by the capacitor C, the current reduction is substantially linear. This corresponds to a hard stop state.

Hence, with soft stop, the following applies approximately to the steepness of the current reduction:

$$dI/dt = R \cdot I/L$$

where I is the gradient current, and with hard stop:

$$dI/dt = (UPST + (R \cdot I))/L \sim UPST/L$$

These considerations apply accordingly with a series connection of n partial output stages; the number of current-carrying semiconductors is N-fold, the total output stage voltage is n·UPST.

Hence, the current rate of rise with a hard stop is higher by the amount n·UPST/L than with a soft stop. Accordingly, the rate of change of the magnetic flux density dB/dt generated by the gradients is lower with a soft stop than with a hard stop.

While current reduction with a hard stop typically has an order of magnitude of 0.2 ms to 1 ms (e.g., "hard stop current reduction period" $t_{Hard}$), with a soft stop, current intensities that may be assumed to be no longer relevant (e.g., "soft stop current reduction period" $t_{Soft}$) are typically only achieved after 5 ms to 40 ms.

Figure 5:
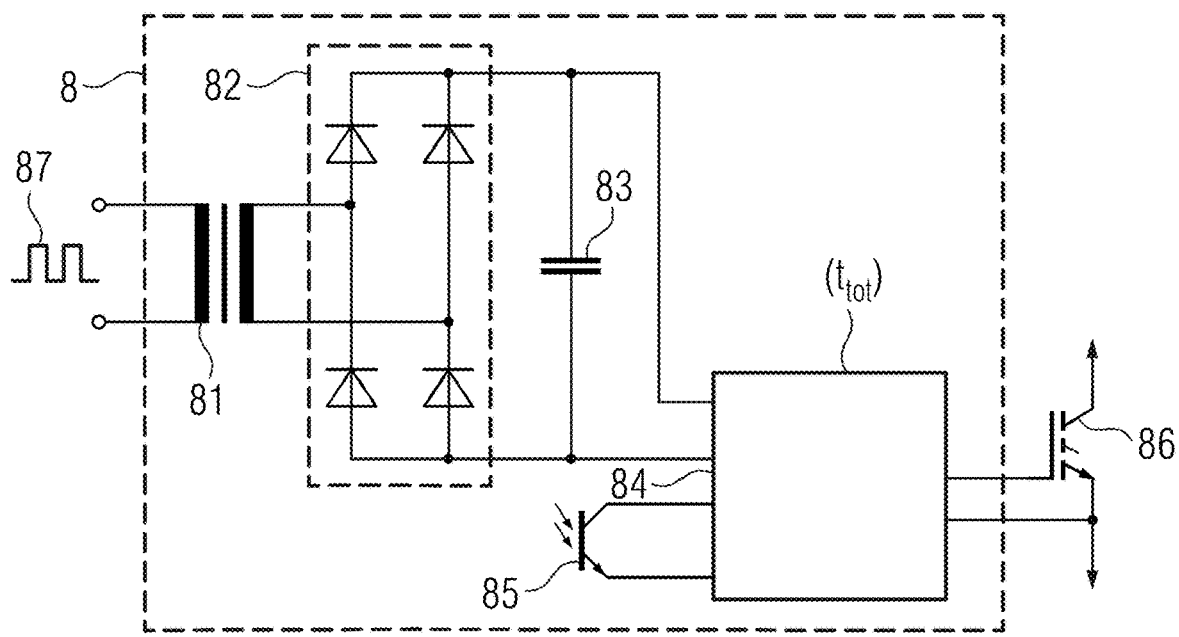
FIG. 5 shows a circuit diagram of one embodiment of a power driver for switching a switching element of the output stage from FIG. 2 to FIG. 4.

FIG. 5 shows a possible non-inverting power driver 8 of the output stage 36 for switching one of the switching elements SE1 to SE4 (e.g., referred to as switching element 86). The power driver 8 is supplied with an alternating signal 87 via a transformer 81. In the power drivers 8, a secondary-side alternating signal is rectified via a rectifier 82 and smoothed by a capacitor 83. The voltage of the capacitor 83 supplies the further electronics 84 of the power driver 8.

The power driver 8 is actuated via a receiver 85 of a galvanically isolating signal transmission (e.g., an optocoupler or an optical fiber path), the transmitter of which is part of the potential isolation apparatus 35. The current requirement of the power driver 8 is primarily determined by the losses for constantly recharging the gate capacitance of the switching element 86 with a predetermined switching frequency. Power consumption is very low in the case of static actuation (e.g., such as occurs with a soft stop).

The following usually applies for the actuation of the power driver 8: if the receiver 85 receives an "on" signal (e.g., light "on" or level "high"), the switching element 86 is switched on. If the receiver 85 does not receive an "on" signal (e.g., no light corresponding to a "low" level), the switching element 86 is switched off.

With an H-bridge with four switching elements 86 (e.g., the switching elements SE1 to SE4), which are actuated by respective power drivers 8, as soon as the receivers 85 of the power drivers 8 do not receive any actuation, all the switching elements 86 are switched off and the H-bridge is in hard stop. If the H-bridge is a partial output stage of an output stage consisting of a plurality of partial output stages switched in series, the complete output stage is in hard stop when receivers 85 of the complete output stage do not receive any actuation.

One problem is that if the actuation of the receivers 85 fails, all the switching elements 86 or SE1 to SE4 of the output stage 36 are blocked, and hence, a hard stop takes place.

Figure 6:
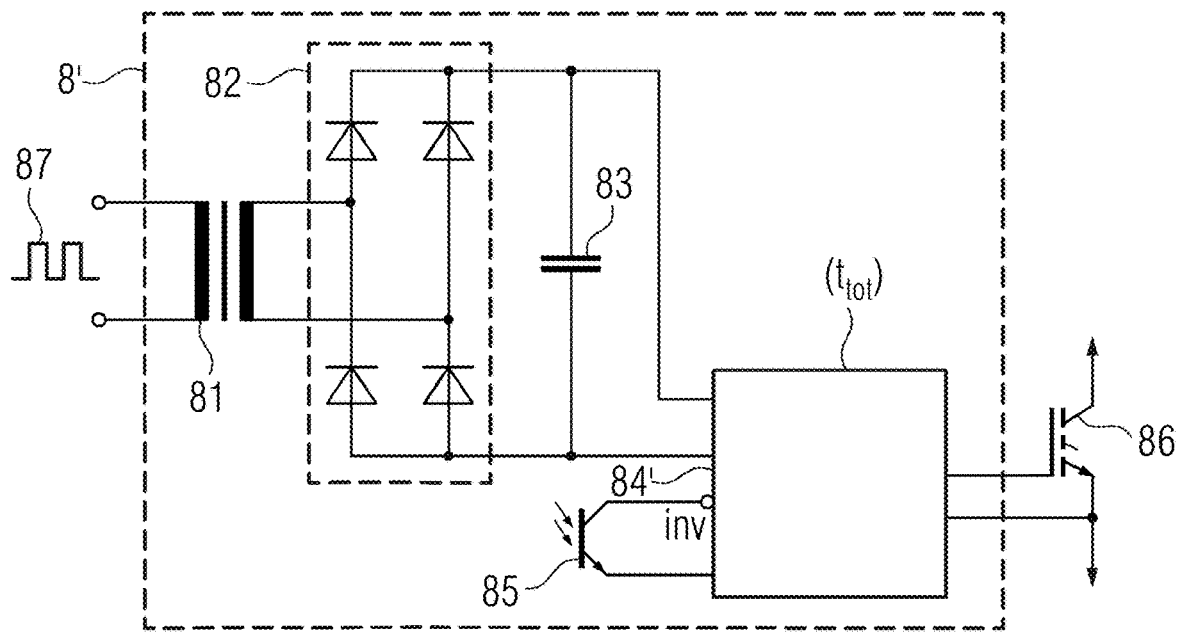
FIG. 6 shows a circuit diagram of one embodiment of an inverted power driver for switching a switching element of the output stage from FIG. 2 to FIG. 4.

This problem may be resolved by using a power driver 8 for actuating part of the switching elements (e.g., SE1 and SE3) and a power driver 8' that is inverted thereto, as shown in FIG. 6. With the inverted power drivers 8', the signal flow is inverted in comparison to the power drivers 8, but otherwise shows the same behavior.

If, for example, in a "self-locking" output stage 36' equipped with both power drivers 8 and 8' (see FIG. 7), the switching elements SE1 and SE3 are actuated by inverting power drivers 8' and the switching elements SE2 and SE4 are actuated by non-inverting power drivers 8, the switching state of the switching elements SE2 to SE4 in FIG. 2 results without actuation of the self-locking output stage 36' (e.g., the self-locking output stage 36' is automatically in the upper free-wheeling circuit without an actuating signal).

If the switching elements SE1 and SE3 are actuated by non-inverting power drivers 8, but the switching elements SE2 and SE4 are actuated by inverting power drivers 8', the switching state of the switching elements SE2 to SE4 shown in FIG. 3 results without actuation of the self-locking output stage 36' (e.g., the self-locking output stage 36' is in the lower free-wheeling circuit without an actuating signal).

The capacitance of the capacitor 83 may be dimensioned such that, in the event of the failure of the supplying alternating voltage 87, the switching element 86 may be switched at normal switching frequency at least for the reaction time of the voltage monitoring facilities 43. After this, energy is still available for at least one switch-on operation, and the last statically switched-on state of the switching element 86 is held for at least $t_{soft}$.

FIG. 7 shows a gradient power amplifier 2' of an MR system MR2. The MR system MR2 includes all the components of the MR system MR, where, in the present case, only the modulator 33', the actuation driver stage 34, the potential isolation apparatus 35, and the self-locking output stage 36' of the associated gradient power amplifier 2' are shown.

The actuating signals of the modulator 33' output at modulator outputs MSE1 to MSE4 for the actuation of the output stage 36' are also inverted when the relevant actuating signal is routed to an inverting power driver 8' of the output stage 36'. As a result, the additional inversions are cancelled again during normal switching.

In the MR system MR, the simultaneous removal of all actuations to the output stage 36 leads to a hard stop (e.g., the switching off of all the switching elements SE1 to SE4 (or SEn in a multistage)), which provides the greatest possible edge steepness during current reduction. When using the "self-locking" output stage 36' with non-inverting and inverting power drivers 8 or 8', the simultaneous removal of all actuations leads to a soft stop (e.g., two of four (output-stage) switching elements SE1 to SE4 are switched on).

In order to prevent damage to the output stage 36', a safety time $t_{tot}$ may optionally be provided in the power drivers 8 or 8', which delays each switch-on of a switching element 86 or SE1 to SE4 in the electronics 84 by $t_{tot}$, while switch-off is not delayed. In this case, the modulator 33' would no longer need to take account of a safety time $t_{tot}$ in actuating signals. Alternatively, the safety time $t_{tot}$ may be implemented in the modulator 33'.

Although the invention has been illustrated and described in more detail by the exemplary embodiments shown, the invention is not restricted thereto, and other variations may be derived herefrom by the person skilled in the art without departing from the scope of protection of the invention.

For example, it is alternatively also possible for the switching elements SE1 and SE3 to be switched in an inverting manner, where then the switching elements SE2 and SE4 are switched in a non-inverting manner.

For example, instead of self-locking N-channel IBGTs, it is also possible to use other semiconductor power switches (e.g., self-conducting semiconductor power switches and/or P-channel semiconductor power switches, etc.). The exemplary embodiments shown above may be adapted accordingly thereto. Further, it is also possible to use ASICs or microcontrollers, etc. instead of FPGAs.

In general, "a", "an", etc. may be a singular or plural (e.g., in the sense of "at least one" or "one or more" etc.), unless this is explicitly excluded, for example, by the expression "exactly one", etc.

Unless explicitly excluded, a number may also include exactly the specified number as well as a usual tolerance range.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance (MR) system with a gradient power amplifier that has at least one output stage that is connectable to a gradient coil and has four switching elements connected to one another as an H-bridge that are switched by respective power drivers with which, to operate the gradient coil, in alternation, the method comprises:
    switching the switching elements attached to a common first pole of a voltage supply to conductive and switching the switching elements attached to a common second pole of the voltage supply to blocking; and
    switching the switching elements attached to the common first pole of the voltage supply to blocking and switching the switching elements attached to the common second pole of the voltage supply to conductive,
    wherein the switching elements attached to the first pole are switched by non-inverting power drivers, and
    wherein the switching elements attached to the second pole are switched by inverting power drivers.

2. The method of claim 1, wherein a modulator of the gradient power amplifier actuates the non-inverting power drivers with an actuating signal and actuates the inverting power drivers with a signal inverted relative to the actuating signal.

3. The method of claim 1, wherein the power drivers in each case have a receiving side of a galvanically isolating separating signal transmission via which the actuating signals are received and forwarded to electronics of the associated power driver, and
    wherein the actuating signals of the inverting power drivers are inverted at the electronics, respectively.

4. The method of claim 3, wherein a capacitor is connected in parallel upstream of power supply connectors of the electronics, a capacitance of the capacitor being dimensioned such that, in the event of a failure of an alternating voltage supplying the power drivers, the switching elements are switchable at normal switching frequency at least for a reaction time of voltage monitoring facilities, after which energy is still available for at least one switch-on operation of the switching elements and a last statically switched-on state of the switching elements is held for at least one soft stop current reduction period.

5. The method of claim 1, wherein the switching elements are actuated by a modulator such that the switching elements are turned on with a delay of a predetermined safety time and switched off without the predetermined safety time.

6. A magnetic resonance (MR) system comprising:
a system controller; and
a gradient power amplifier,
wherein the gradient power amplifier comprises:
at least one output stage that is connectable to a gradient coil; and
four switching elements connected to one another as an H-bridge that are switched by respective power drivers, and
wherein the switching elements attached to a common first pole of a voltage supply are configured to be switched by non-inverting power drivers,
wherein the switching elements attached to a common second pole of the voltage supply are configured to be switched by inverting power drivers, and
wherein, to operate the gradient coil, the switching elements attached to the common first pole and the switching elements attached to the common second pole are configured to be switched in alternation between conductive and blocking.

7. The MR system of claim 6, wherein the four switching elements are in the form of bipolar transistors,
wherein the MR system further comprises four diodes,
wherein a collector terminal of a first switching element of the four switching elements is attached to the common first pole and an emitter terminal of the first switching element is attached to a collector terminal of a second switching element of the four switching elements,
wherein an emitter terminal of the second switching element is attached to the common second pole,
wherein a center terminal between the first switching element and the second switching element is connected to a center terminal of a series connection of a first diode of the four diodes and a second diode of the four diodes,
wherein a cathode terminal of the first diode is attached to a positive pole,
wherein an anode terminal of the second diode is attached to a negative pole,
wherein a collector terminal of a third switching element of the four switching elements is attached to the common first pole, and an emitter terminal of the third switching element is attached to a collector terminal of a fourth switching element of the four switching elements,
wherein an emitter terminal of the fourth switching element is attached to the common second pole,
wherein a center terminal between the third switching element and the fourth switching element is connected to a center terminal of a series connection of a third diode of the four diodes and a fourth diode of the four diodes,
wherein a cathode terminal of the third diode is attached to the positive pole, and
wherein an anode terminal of the fourth diode is attached to the negative pole.

8. The MR system of claim 7, wherein the four switching elements are normal-blocking N-channel IGBTs.

9. The MR system of claim 7, wherein at least one gradient coil is attached to an output of the output stage that is connected to the center terminals between the first switching element and the second switching element and between the first diode and the second diode, and is attached to an output of the output stage that is connected to the center terminals between the third switching element and the fourth switching element and between the third diode and the fourth diode.

10. In a non-transitory computer-readable storage medium that stores instructions executable by a magnetic resonance (MR) system to operate the MR system with a gradient power amplifier that has at least one output stage that is connectable to a gradient coil and has four switching elements connected to one another as an H-bridge that are switched by respective power drivers with which, to operate the gradient coil, in alternation, the instructions comprise:
switching the switching elements attached to a common first pole of a voltage supply to conductive and switching the switching elements attached to a common second pole of the voltage supply to blocking; and
switching the switching elements attached to the common first pole of the voltage supply to blocking and switching the switching elements attached to the common second pole of the voltage supply to conductive,
wherein the switching elements attached to the first pole are switched by non-inverting power drivers, and
wherein the switching elements attached to the second pole are switched by inverting power drivers.

11. The non-transitory computer-readable storage medium of claim 10, wherein a modulator of the gradient power amplifier actuates the non-inverting power drivers with an actuating signal and actuates the inverting power drivers with a signal inverted relative to the actuating signal.

12. The non-transitory computer-readable storage medium of claim 10, wherein the power drivers in each case have a receiving side of a galvanically isolating separating signal transmission via which the actuating signals are received and forwarded to electronics of the associated power driver, and
wherein the actuating signals of the inverting power drivers are inverted at the electronics, respectively.

13. The non-transitory computer-readable storage medium of claim 12, wherein a capacitor is connected in parallel upstream of the power supply connectors of the electronics, a capacitance of the capacitor being dimensioned such that, in the event of a failure of an alternating voltage supplying the power drivers, the switching elements are switchable at normal switching frequency at least for a reaction time of voltage monitoring facilities, after which energy is still available for at least one switch-on operation of the switching elements and a last statically switched-on state of the switching elements is held for at least one soft stop current reduction period.

14. The non-transitory computer-readable storage medium of claim 10, wherein the switching elements are actuated by a modulator such that the switching elements are turned on with a delay of a predetermined safety time and switched off without the predetermined safety time.

* * * * *